(12) United States Patent
Baumgartner et al.

(10) Patent No.: US 7,733,984 B2
(45) Date of Patent: Jun. 8, 2010

(54) IMPLEMENTING PHASE ROTATOR CIRCUITS WITH EMBEDDED POLYPHASE FILTER NETWORK STAGE

(75) Inventors: Steven John Baumgartner, Zumbro Falls, MN (US); Anthony Richard Bonaccio, Shelburne, VT (US); John Francis Bulzacchelli, Yonkers, NY (US); Daniel Mark Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 834 days.

(21) Appl. No.: 11/557,695

(22) Filed: Nov. 8, 2006

(65) Prior Publication Data
US 2008/0107212 A1 May 8, 2008

(51) Int. Cl.
*H04L 27/00* (2006.01)

(52) U.S. Cl. ........................... 375/324; 375/308

(58) Field of Classification Search .................. 375/271, 375/279, 302, 308, 322, 324, 329
See application file for complete search history.

(56) References Cited

U.S. PATENT DOCUMENTS

| 4,723,318 | A * | 2/1988 | Marshall | 455/109 |
|---|---|---|---|---|
| 6,380,783 | B1 | 4/2002 | Chao et al. | |
| 7,164,901 | B2 * | 1/2007 | Zheng et al. | 455/324 |
| 2007/0081610 | A1 * | 4/2007 | Krivokapic et al. | 375/302 |

* cited by examiner

*Primary Examiner*—David B Lugo
(74) *Attorney, Agent, or Firm*—Joan Pennington

(57) ABSTRACT

A method for implementing phase rotator circuits and phase rotator circuit of the invention includes a polyphase filter network to create a quadrature phase version of the input signal. The polyphase filter network is partitioned into a first part that is physically isolated from the phase rotator circuit and a second part that is embedded in the phase rotator circuit. The second part of the polyphase filter is coupled to the first part of the polyphase filter by a high-pass equalizing buffer stage. The second part of the polyphase filter is coupled to the phase rotator circuit by a bandlimiting buffer stage.

18 Claims, 4 Drawing Sheets

IMPLEMENTING PHASE ROTATOR CIRCUITS WITH EMBEDDED POLYPHASE FILTER NETWORK STAGE

FIELD OF THE INVENTION

The present invention relates generally to the data processing field, and more particularly, relates to a method for implementing phase rotator circuits and a phase rotator circuit with an embedded polyphase filter network stage.

DESCRIPTION OF THE RELATED ART

In many applications, a need exists to precisely align the phase of a first electrical signal waveform with the phase of a second electrical signal waveform. Commonly this task is performed by some form of phase locked loop (PLL) circuit. Many such PLL circuits are described in the art. Some circuits have the capability of matching both the phase and the frequency of the two signals. Other such PLL circuits are optimized to match only the phase; such circuits are frequently used in applications in which the respective frequencies of the first and second signals are otherwise controlled and matched.

A need exists for an enhanced method and apparatus for making phase adjustments in the second type of PLL circuits that are optimized to match only the phase. One exemplary application where such a circuit is useful is a system called a source-synchronous data interface, in which a first signal waveform (or group of signal waveforms) conveying random binary information, 1's and 0's represented by high and low voltages or currents, respectively, is accompanied by a second signal waveform conveying regularly alternating binary information. The second signal waveform is referred to as a clock signal, and in many implementations its period is twice the minimum allowed interval between changes in the binary state conveyed by the first waveform. The period of the second signal waveform and the minimum interval between changes in the first waveform are controlled and matched by other mechanisms.

Signal channels that are used to convey such first and second signal waveforms suffer from a variety of impairments. Some impairments adversely affect the phase or amplitude of the signal but not the frequency. In some source-synchronous data interfaces it is necessary to restore the proper phase between the two signals at the receiving end. For example, one signal may suffer from more delay in the transmission network than the other. Also some impairments may be time-variant so that a continuous monitoring and adjustment of the respective phases of the two signals is required. It is possible to achieve such behavior using a phase-locked loop (PLL) circuit. The PLL circuit includes a phase detector to determine the difference in phase between the two signals and stimulate the remaining components in the loop to drive this phase difference to zero. This is done by adjusting the phase of one or the other of the two signals.

Phase adjustment is commonly performed in one of two ways. In one approach, the PLL can be configured with a local voltage-controlled oscillator that is forced to phase and frequency-lock with the incoming clock waveform; the output of the oscillator replaces the incoming clock. Phase adjustments in such a system are made by very briefly changing the frequency of the oscillator by a small amount then changing it back to its original value. Over a series of such corrections the phase of the oscillator is forced to change due to the relationship between the phase and the frequency.

Another approach also known in the prior art is to place a circuit in series with the received clock waveform, with this circuit having the capability of delaying the waveform by an amount of time adjustable based on a digital code generated by the phase detector. In this way the phase detector can select the optimum phase from the delay circuit so as to cause the phases of the original two signals to be identical, or some other desired relationship. One circuit capable of providing such a programmable phase shift is called a phase rotator. Such circuits are also commonly referred to as phase mixers or phase interpolators.

The phase rotator circuits operate by mixing together weighted versions of the available phases of the clock signal. This requires that additional phases of the clock signal be available in the first place. One way of generating such phases is called a polyphase filter, which is a passive electrical network that can create a quadrature phase, that is, a version of the signal shifted in phase by 90 degrees or one-quarter period, of an input signal. Once this quadrature phase is generated other known techniques can be used to create inverse phases of the original signal and its quadrature signal. This provides essentially 0, 90, 180 (created from 0), and 270 (created from 90) degree phases of the original (0 degree phase) clock signal.

Phase rotator implementations are known in the prior art. In the prior art arrangements, some phase rotator circuits have been driven by polyphase filters via a wideband or equalizing buffer. This phase rotator circuit arrangement reflects a segmented approach in which the polyphase filter and the phase rotator circuit are completely independent of one another. The equalizing buffer has been added in some implementations in an attempt to control the frequency content of the waveform immediately prior to being processed by the phase rotator mixer circuit.

The mixing circuit operates by applying a unique weighting factor to each of the incoming phases and summing the weighted components to produce a resultant of the desired phase. The mixing weights are controlled by either a plurality of analog control signals or a plurality of digital control buses combined with digital-to-analog converters (DACs). This mixing action can create any number of intermediate phases of the signal, for example 64 possible phases of 360/64=5.625 degrees each. Note that for a single mixer circuit only one of these phases can be selected at any given time.

It can be easily shown that such a weighted mixing applied to sinusoidal waveforms achieves the desired resultant phase shift quite accurately and predictably. However, the same is not true when the signals are square waves. In source-synchronous data interfaces, great effort is expended to keep the signals square waves for circuit performance reasons. From the mixer's standpoint, this is in effect the introduction of frequency components into the input signals other than those desired. This has a deleterious effect on the performance of the mixer circuit. In particular, stimulating the mixer with square waves affects the linearity of the phase control-to-output phase transfer function of the overall phase rotator circuit, creating flat spots at some phase control points. This changes the gain of the phase-locked loop, which can degrade loop performance and stability.

A further impairment to proper operation of a phase rotator circuit is any error in the phase separation between the incoming signal phases. If, for example, the desired 0-90-180-270 phases are actually 0-95-180-275 then the positioning of some points on the transfer function will be incorrect. Specifically those depending on weighting the 90 and 270 degree phase signals will be distorted. This would be true even if the incoming signals were pure tone sinusoids. One source of such phase separation error is in the distribution network between the phase generation circuit and the phase rotator circuit.

Frequently these clock phase signals are required at numerous, widely separated points in the source-synchronous data interface circuit. For example, this occurs when a plurality of data channels in a source-synchronous interface share a single clock channel. This requires a substantial distribution network with long wires and many buffers. Less than perfect symmetry and balance in this distribution network can lead to phase separation error.

SUMMARY OF THE INVENTION

A principal aspect of the present invention is to provide a method for implementing phase rotator circuits and a phase rotator circuit with an embedded polyphase filter network. Other important aspects of the present invention are to provide such method for implementing phase rotator circuits and a phase rotator circuit with an embedded polyphase filter network substantially without negative effect and that overcome many of the disadvantages of prior art arrangements.

In brief, a method for implementing phase rotator circuits and a phase rotator circuit with an embedded polyphase filter network are provided. The phase rotator circuit of the invention includes a polyphase filter network to create a quadrature phase version of the input signal. The polyphase filter network is partitioned into a first part that is physically isolated from the phase rotator circuit and a second part that is embedded in the phase rotator circuit.

In accordance with features of the invention, the second part of the polyphase filter is coupled to the first part of the polyphase filter by a first buffer stage having a predefined peaking frequency response characteristic. The second part of the polyphase filter is coupled to the phase rotator circuit by a second buffer stage preferably having a low-pass frequency response characteristic.

In accordance with features of the invention, the phase rotator circuit overcomes the impairments of square wave stimulus and incorrect input phase spacing in a conventional phase rotator circuit.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and apparatus are provided to overcome the conventional impairments of square wave stimulus and incorrect input phase spacing in a phase rotator circuit. A portion of a polyphase filter network is included locally or embedded within the phase rotator circuit.

In accordance with features of the invention, a phase rotator circuit of the invention includes a polyphase filter network to create a quadrature phase version of the input signal. The polyphase filter network is partitioned into a first part that is physically isolated from the phase rotator circuit and a second part that is embedded in the phase rotator circuit. The second part of the polyphase filter is coupled to the first part of the polyphase filter by a first (equalizing) buffer stage preferably having a predefined peaking frequency response. The second part of the polyphase filter is coupled to the phase rotator circuit by a second buffer stage preferably having a low-pass frequency response.

Figure 1:
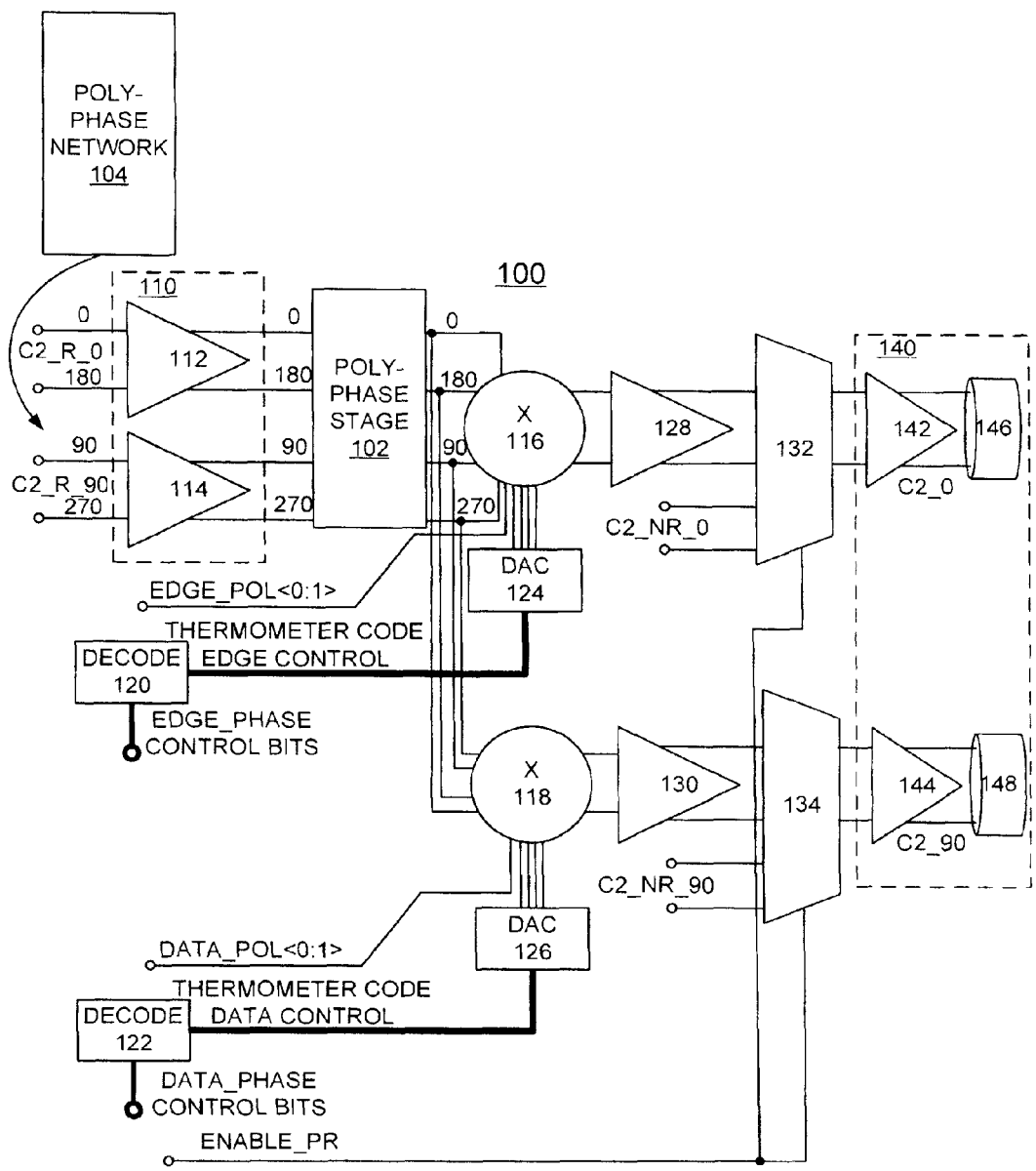
FIG. 1 is a block diagram illustrating an exemplary phase rotator circuit in accordance with the preferred embodiment.

Having reference now to the drawings, in FIG. 1, there is shown a phase rotator circuit generally designated by the reference character 100 in accordance with the preferred embodiment. Phase rotator circuit 100 includes an embedded polyphase stage 102 in accordance with the preferred embodiment. A first polyphase filter network portion 104 coupled to a first buffer stage 110 is physically isolated from the phase rotator circuit 100. The input buffer stage 110 of phase rotator circuit 100 includes a pair of first buffer circuits 112, 114 preferably having a predefined peaking frequency response.

Figure 2:
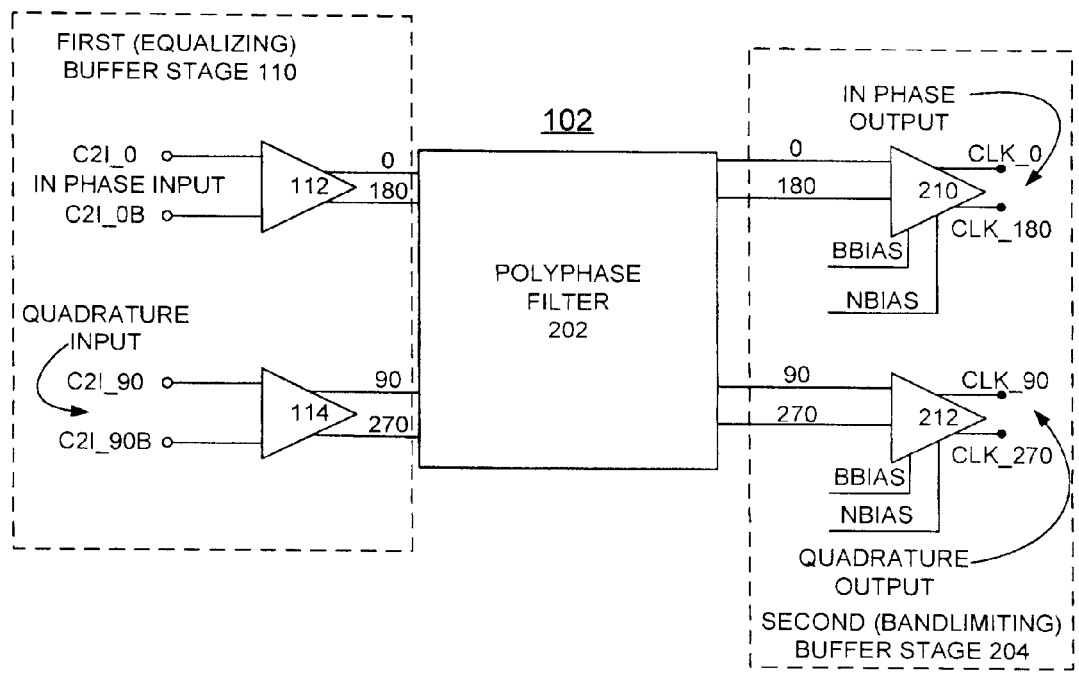
FIG. 2 is a block diagram illustrating an exemplary polyphase stage of the phase rotator circuit of FIG. 1 in accordance with the preferred embodiment.

Referring also to FIG. 2, the embedded polyphase stage 102 is further illustrated and described. The embedded polyphase stage 102 includes a polyphase filter 202 having inputs coupled to the pair of first buffers 112, 114 of the first buffer stage 110. The polyphase filter 202 is a conventional polyphase filter having a selected frequency response. A respective pair of outputs 0, 180 (created from 0); and 90, and 270 (created from 90) degree phases of the polyphase filter 202 are applied to a second buffer stage 204 including a pair of second buffer circuits 210, 212 preferably having a low-pass frequency response. The second buffers 210, 212 respectively provide an in phase output CLK_0, CLK_180 and a quadrature output CLK_90, CKL_270.

The first buffer stage 110 preferably having a selected peaking frequency response is provided to increase the amplitude of the input signals at a set frequency of interest relative to DC, followed by the actual passive polyphase filter 202, followed subsequently by a second buffer stage 204. The buffers 210, 212 of the second buffer stage 204 having a predefined lowpass response serve to reduce the energy of frequency components above a predefined clock frequency.

Referring now to FIGS. 1 and 2, the in phase outputs CLK_0, CLK_180 and the quadrature outputs CLK_90, CLK_270 of the bandlimiting buffers 210, 212 are applied to a pair of multipliers (or phase rotators) 116, 118. These signals are mixed together in the phase rotator circuits 116, 118. The mixing weights are controlled by a plurality of binary control signals applied to a pair of decode circuits 120, 122. The decoded binary control signals are applied to one of a pair of digital-to-analog converters (DACs) 124, 126 that have analog outputs applied to the respective multipliers 116, 118 to serve as the mixing weights. The mixing circuit operates by applying a unique weighting factor to each of the incoming phases and summing the weighted components to produce a resultant of the desired phase. The outputs of the multipliers or phase rotators 116, 118 are applied to a respective phase buffer 128, 130 and are coupled via a respective multiplexer 132, 134 to an output stage 140, which includes a pair of clock buffers 142, 144. Each of the clock buffers 142, 144 is coupled to a respective one of a pair of clock distribution networks 146, 148. In a preferred embodiment, the second input of multiplexers 132, 134 is coupled to an auxiliary clock input signal that can be used in testing and debug to bypass the phase rotators.

In accordance with features of the invention, the phase rotator mixer circuit is stimulated by precise quadrature phase signals as a result of the proximity of the polyphase stage 102 including the polyphase filter 202 embedded within the actual phase rotator 100, and having controlled frequency content as a result of the high-pass equalizing or peaking buffers 112, 114, the inherent bandpass response of the polyphase filter 202 of the polyphase stage 102 and the bandlimited buffer stage 204 between the second part or polyphase stage 102 including the polyphase filter 202 and the phase rotator mixer circuit multipliers 116, 118 shown in FIG. 1.

Figure 3:
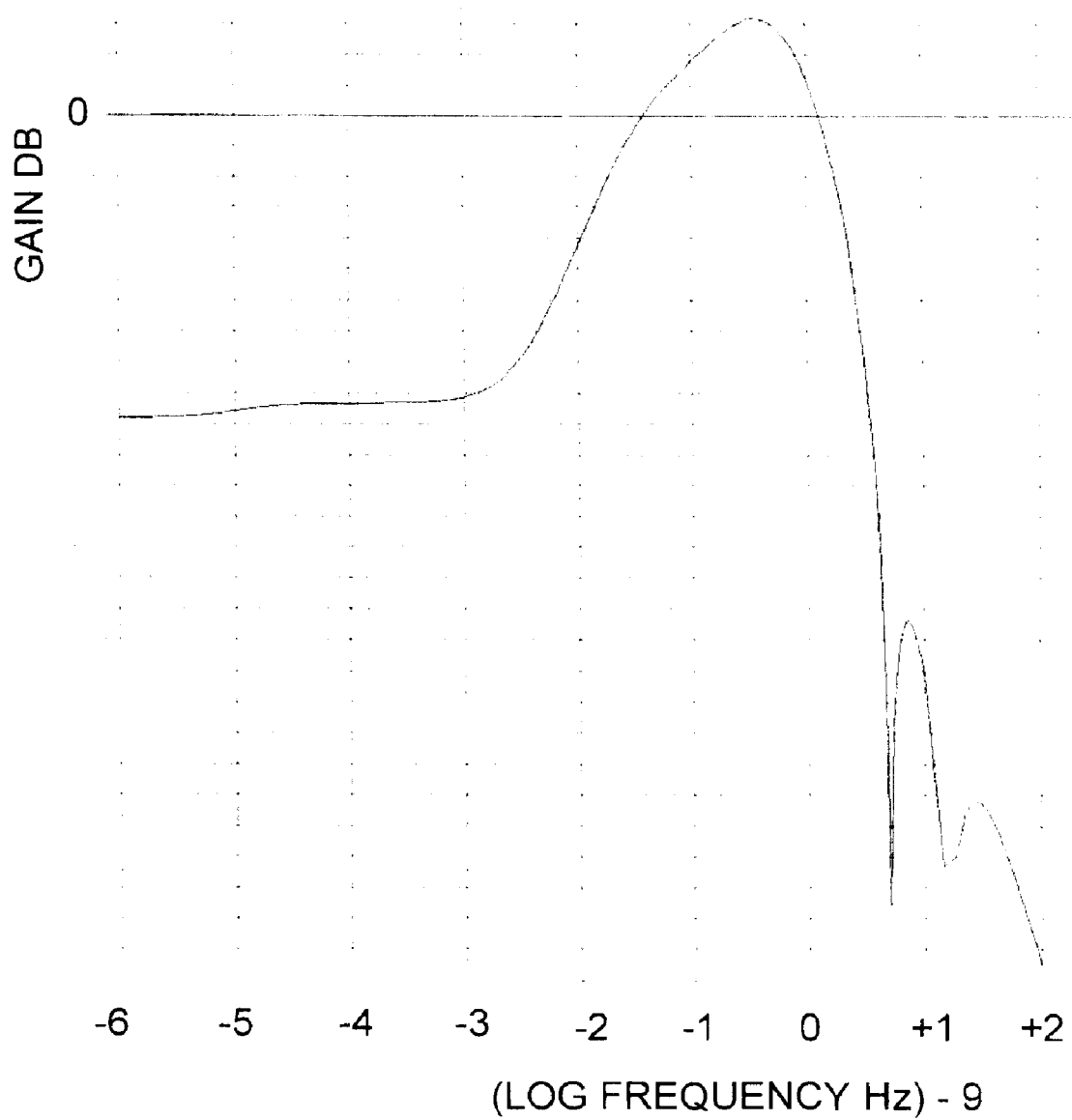
FIGS. 3 and 4 are diagrams illustrating exemplary operation of the phase rotator circuit including the poly-phase stage of FIGS. 1 and 2 in accordance with the preferred embodiment.
Figure 4:
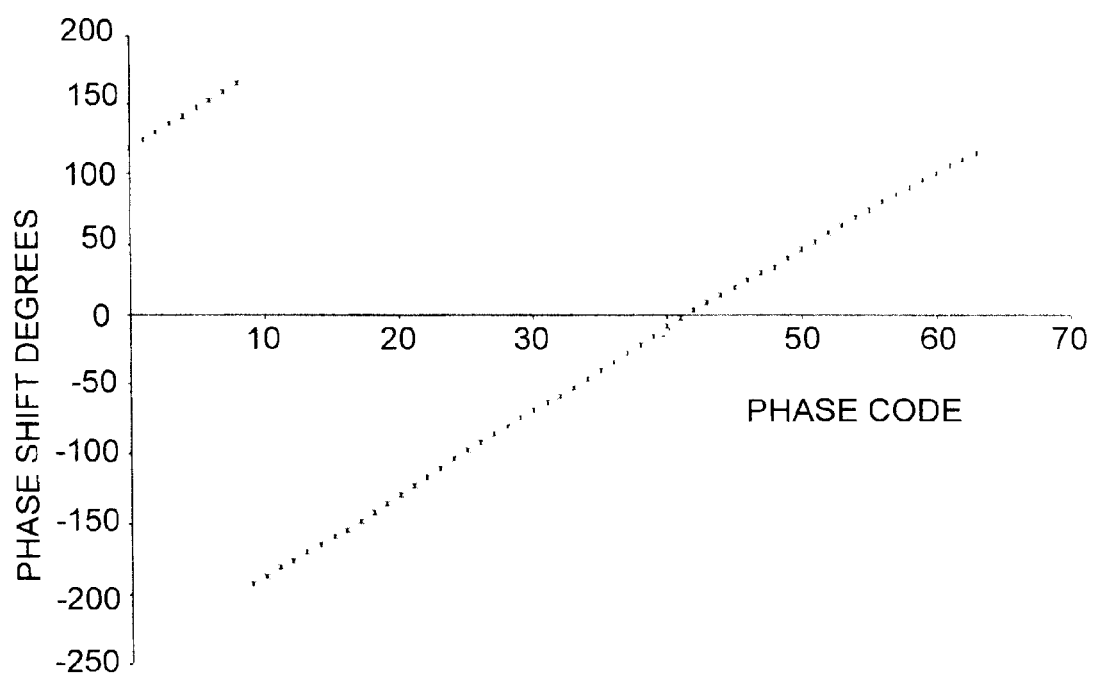

Referring now to FIGS. 3 and 4, exemplary operation of the phase rotator circuit 100 including the polyphase stage 102 of FIGS. 1 and 2 in accordance with the preferred embodiment are shown.

FIG. 3 shows an exemplary frequency response of the polyphase stage 102 in FIG. 2. The plot shows the transfer gain in dB between the differential input and differential signal at the in-phase output of the polyphase stage. Note the peaking in the response at an exemplary frequency of interest in accordance with a preferred embodiment. This frequency is adjusted by controlling the frequency responses of the first and second buffer stages and the polyphase stage.

FIG. 4 shows exemplary phase rotator transfer functions achieved with phase rotator 100 with the embedded polyphase stage 102. In FIG. 4, phase shift in degrees along the vertical axis and phase code is generally illustrated along the horizontal axis. Note the generally linear, constant slope characteristics of the illustrated curves.

While the present invention has been described with reference to the details of the embodiments of the invention shown in the drawing, these details are not intended to limit the scope of the invention as claimed in the appended claims.

What is claimed is:

1. A polyphase filter network used with a phase rotator circuit comprising:
   said polyphase filter network creating a quadrature phase version of an input signal,
   said polyphase filter network being partitioned into a first part and a second part;
   said first part of said polyphase filter network being coupled to inputs of a first buffer stage of the phase rotator circuit;
   said first buffer stage including an equalizing buffer stage increasing amplitude of each respective input signal at a predefined frequency relative to DC;
   said second part of said polyphase filter network being coupled to outputs of said first equalizing buffer stage and being embedded in the phase rotator circuit; said second part of said polyphase filter network having a selected frequency response and being coupled to a pair of phase rotator multipliers of the phase rotator circuit by a second buffer stage;
   said second buffer stage including a lowpass buffer stage having a predefined lowpass frequency response and providing in-phase clock signals and quadrature clock signals to said pair of phase rotator multipliers; and
   said pair of phase rotator multipliers of the phase rotator circuit receiving mixing weights controlled by a plurality of binary control signals applied by a pair of digital-to-analog converters (DACs).

2. The polyphase filter network used with the phase rotator circuit as recited in claim 1 includes a pair of phase buffers receiving outputs of said pair of phase rotator multipliers of the phase rotator circuit, and said pair of phase buffers are coupled to an output stage of the phase rotator circuit.

3. The polyphase filter network used with the phase rotator circuit as recited in claim 2 includes a respective multiplexer coupling said pair of phase buffers to said output stage of the phase rotator circuit, and said output stage including a pair of clock buffers, each respective clock buffer being coupled to a respective clock distribution network.

4. The polyphase filter network used with the phase rotator circuit as recited in claim 1 wherein said second part of said polyphase filter network includes a polyphase filter, said polyphase filter comprising a passive polyphase filter.

5. The polyphase filter network used with the phase rotator circuit as recited in claim 2 wherein said first equalizing buffer stage is a high-pass equalizing buffer stage.

6. The polyphase filter network used with the phase rotator circuit as recited in claim 1 wherein said first equalizing buffer stage includes a pair of wideband buffers.

7. The polyphase filter network used with the phase rotator circuit as recited in claim 1 wherein said second buffer stage provides said predefined lowpass frequency response to reduce energy of frequency components above a predefined clock frequency.

8. The polyphase filter network used with the phase rotator circuit as recited in claim 1 wherein said second buffer stage includes a pair of bandpass buffers.

9. The polyphase filter network used with the phase rotator circuit as recited in claim 4 wherein said first part of said polyphase filter network produces in-phase and quadrature clock signals.

10. The polyphase filter network used with the phase rotator circuit as recited in claim 5 wherein said second part of said polyphase filter network produces said in-phase and quadrature clock signals having controlled frequency content as a result of said high-pass equalizing buffer stage.

11. The polyphase filter network used with the phase rotator circuit as recited in claim 5 wherein said second part of said polyphase filter network generates four clock signals in which each clock signal has a different phase.

12. A method for implementing phase rotator circuits comprising the steps of:
   providing a polyphase filter network creating a quadrature phase version of an input signal including in-phase clock signals and quadrature clock signals;
   partitioning said polyphase filter network into a first part and a second part; said first part of said polyphase filter network being coupled to inputs of a first buffer stage of the phase rotator circuit and said first buffer stage including an equalizing buffer stage increasing amplitude of each respective input signal at a predefined frequency relative to DC; said second part of said polyphase filter network being coupled to outputs of said first equalizing buffer stage and being embedded in the phase rotator circuit; said second part of said polyphase filter network having a selected frequency response and being coupled to a pair of phase rotator multipliers of the phase rotator circuit by a second buffer stage; said second buffer stage including a lowpass buffer stage having a predefined lowpass frequency response and providing in-phase clock signals and quadrature clock signals to said pair of phase rotator multipliers; and
   providing a pair of digital-to-analog converters (DACs) for applying mixing weights controlled by a plurality of binary control signals to said pair of phase rotator multipliers of the phase rotator circuit.

13. The method for implementing phase rotator circuits as recited in claim 12 includes providing a pair of phase buffers for receiving outputs of said pair of phase rotator multipliers of the phase rotator circuit and coupling said pair of phase buffers to an output stage of the phase rotator circuit.

14. The method for implementing phase rotator circuits as recited in claim 13 includes coupling a respective multiplexer coupling said pair of phase buffers to said output stage of the phase rotator circuit, and said output stage including a pair of clock buffers, coupling each respective clock buffer to a respective clock distribution network.

15. The method for implementing phase rotator circuits as recited in claim 12 includes providing high-pass equalizing buffers in said first equalizing buffer stage.

16. The method for implementing phase rotator circuits as recited in claim 12 includes providing a polyphase filter within said second part of said polyphase filter network, said polyphase filter comprising a passive polyphase filter.

17. The method for implementing phase rotator circuits as recited in claim 15 wherein said second part of said polyphase filter network produces said in-phase clock signals and quadrature clock signals having controlled frequency content as a result of said high-pass equalizing buffers.

18. The method for implementing phase rotator circuits as recited in claim 12 includes providing bandlimiting buffers in said second buffer stage having said predefined lowpass frequency response to reduce energy of frequency components above a predefined clock frequency.

* * * * *